(12) United States Patent
Tao et al.

(10) Patent No.: US 10,712,420 B2
(45) Date of Patent: Jul. 14, 2020

(54) SYSTEMS AND METHODS FOR CONCOMITANT FIELD CORRECTION IN MAGNETIC RESONANCE IMAGING WITH ASYMMETRIC GRADIENTS

(71) Applicant: MAYO FOUNDATION FOR MEDICAL EDUCATION AND RESEARCH, Rochester, MN (US)

(72) Inventors: Shengzhen Tao, Rochester, MN (US); Joshua D. Trzasko, Rochester, MN (US); Yunhong Shu, Rochester, MN (US); Paul T. Weavers, Rochester, MN (US); Matthew A. Bernstein, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 65 days.

(21) Appl. No.: 15/577,165

(22) PCT Filed: May 25, 2016

(86) PCT No.: PCT/US2016/034018
§ 371 (c)(1),
(2) Date: Nov. 27, 2017

(87) PCT Pub. No.: WO2016/196103
PCT Pub. Date: Dec. 8, 2016

(65) Prior Publication Data
US 2018/0203088 A1  Jul. 19, 2018

Related U.S. Application Data
(60) Provisional application No. 62/168,364, filed on May 29, 2015, provisional application No. 62/219,464, filed on Sep. 16, 2015.

(51) Int. Cl.
*G01R 33/565* (2006.01)
*G01R 33/563* (2006.01)
*G01R 33/561* (2006.01)

(52) U.S. Cl.
CPC . *G01R 33/56581* (2013.01); *G01R 33/56554* (2013.01); *G01R 33/56563* (2013.01); *G01R 33/563* (2013.01); *G01R 33/5616* (2013.01)

(58) Field of Classification Search
CPC ........ G01R 33/56581; G01R 33/56554; G01R 33/56563; G01R 33/563; G01R 33/5616;
(Continued)

(56) References Cited

U.S. PATENT DOCUMENTS 5,289,127 A   2/1994  Doddrell
5,770,943 A *  6/1998  Zhou ................ G01R 33/56518
                                              324/307

(Continued)

FOREIGN PATENT DOCUMENTS

| CN | 102342832 A | 2/2012 |
|---|---|---|
| CN | 103596496 A | 2/2014 |
| JP | H1189817 A | 4/1999 |

OTHER PUBLICATIONS

Written Opinion and Search Report dated Aug. 18, 2016 in connection with PCT/US2016/034018.
(Continued)

*Primary Examiner* — Christopher P McAndrew
(74) *Attorney, Agent, or Firm* — Quarles & Brady LLP (57) ABSTRACT

Systems and methods for performing concomitant field corrections in magnetic resonance imaging ("MRI") systems that implement asymmetric magnetic field gradients are provided, in general, the systems and methods described
(Continued)

16 Claims, 5 Drawing Sheets (58) Field of Classification Search
CPC .......... G01R 33/5608; G01R 33/5611; G01R 33/4828; G01R 33/4835; G01R 33/543
USPC .......................................... 324/309
See application file for complete search history.

(56) References Cited

U.S. PATENT DOCUMENTS

| | | | | |
|---|---|---|---|---|
| 6,025,715 | A * | 2/2000 | King | G01R 33/385 324/309 |
| 6,211,675 | B1 * | 4/2001 | Ganin | G01R 33/56518 324/309 |
| 6,369,568 | B1 * | 4/2002 | Ma | G01R 33/56554 324/307 |
| 6,515,478 | B1 * | 2/2003 | Wicklow | G01R 33/56581 324/307 |
| 7,944,206 | B2 * | 5/2011 | Frydman | G01R 33/4822 324/307 |
| 8,306,289 | B1 * | 11/2012 | Meyer | G01R 33/5611 378/21 |
| 8,436,613 | B2 | 5/2013 | Feiweir | |
| 8,781,146 | B2 * | 7/2014 | Haymond | H04R 1/347 381/336 |
| 2005/0218894 | A1 * | 10/2005 | Miyawaki | G01R 33/56518 324/309 |
| 2007/0222446 | A1 * | 9/2007 | Jung | G01R 33/4833 324/307 |
| 2011/1029165 | | 12/2011 | Umeda | |
| 2014/0312897 | A1 * | 10/2014 | Tan | G01R 33/56572 324/307 |

OTHER PUBLICATIONS

C. Meier et al, "Maxwell Field Terms in Flow Quantifying Phase Images for an Asymmetric Gradient Coil", Proc. Intl. Soc. Mag. Rseon. Med. 13 (2005), p. 2283.
Baron, C. A., et al. "The effect of concomitant gradient fields on diffusion tensor imaging." Magnetic resonance in medicine 68.4 (2012): 1190-1201.
Bernstein, M. A., et al. "Concomitant gradient terms in phase contrast MR: analysis and correction." Magnetic resonance in medicine 39.2 (1998): 300-308.
Chen, W., et al. "Fast conjugate phase image reconstruction based on a Chebyshev approximation to correct for B0 field inhomogeneity and concomitant gradients." Magnetic Resonance in Medicine: An Official Journal of the International Society for Magnetic Resonance in Medicine 60.5 (2008): 1104-1111.
Cheng, J. Y., et al. "Fast concomitant gradient field and field inhomogeneity correction for spiral cardiac imaging." Magnetic resonance in medicine 66.2 (2011): 390-401.
China National Intellectual Property Administration, Office Action and search report for application 201680031013.2, dated Aug. 16, 2019, with machine translation.
Du, Y. P., et al. "Correction of concomitant magnetic field-induced image artifacts in nonaxial echo-planar imaging." Magnetic Resonance in Medicine: An Official Journal of the International Society for Magnetic Resonance in Medicine 48.3 (2002): 509-515.
European Patent Office, Extended European Search Report and Search Opinion for application 16804018.6, dated Dec. 21, 2018.
Hsu, Y.-C., et al. "Efficient concomitant and remanence field artifact reduction in ultra-low-field MRI using a frequency-space formulation." Magnetic resonance in medicine 71.3 (2014): 955-965.
King, K. F., et al. "Concomitant gradient field effects in spiral scans." Magnetic Resonance in Medicine: An Official Journal of the International Society for Magnetic Resonance in Medicine 41.1 (1999): 103-112.
Meier, C., et al. "Concomitant field terms for asymmetric gradient coils: consequences for diffusion, flow, and echo-planar imaging." Magnetic Resonance in Medicine: An Official Journal of the International Society for Magnetic Resonance in Medicine 60.1 (2008): 128-134.
Myers, W. R., et al. "Correction of concomitant gradient artifacts in experimental microtesla MRI." Journal of magnetic resonance 177.2 (2005): 274-284.
Sica, C. T., et al. "Concomitant gradient field effects in balanced steady-state free precession." Magnetic Resonance in Medicine: An Official Journal of the International Society for Magnetic Resonance in Medicine 57.4 (2007): 721-730.
Tao, S., et al. "Closed-form solution concomitant field correction method for echo planar imaging on head-only asymmetric gradient." Proceedings of the 23rd annual meeting of the ISMRM. 2015.
Zhou, X. J., et al. "Concomitant magnetic-field-induced artifacts in axial echo planar imaging." Magnetic resonance in medicine 39.4 (1998): 596-605.
Zhou, X. J., et al. "Artifacts induced by concomitant magnetic field in fast spin-echo imaging." Magnetic resonance in medicine 40.4 (1998): 582-591.

* cited by examiner

SYSTEMS AND METHODS FOR CONCOMITANT FIELD CORRECTION IN MAGNETIC RESONANCE IMAGING WITH ASYMMETRIC GRADIENTS

CROSS-REFERENCE TO RELATED APPLICATIONS

This application represents the national stage entry of PCT International Application No. PCT/US2016/034018 filed on May 25, 2016 and, claims the benefit of U.S. Provisional Patent Application Ser. No. 62/168,364, filed on May 29, 2015, and U.S. Provisional Patent Application Ser. No. 62/219,464, filed on Sep. 16, 2015, all of which are hereby incorporated by reference as if set forth in their entirety.

STATEMENT REGARDING FEDERALLY SPONSORED RESEARCH

This invention was made with government support under EB010065 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for concomitant field correction and compensation when implementing asymmetric gradients during an MRI scan.

According to Maxwell's equations, a magnetic field gradient used for spatial encoding in MRI is always accompanied by spatially variant higher order magnetic fields, which are conventionally termed as "concomitant fields." Conventionally, only the concomitant field terms below the third order are considered significant. The spatial dependence and composition of the concomitant terms depend on the MRI gradient system design.

Conventional MRI gradient systems usually have cylindrical symmetric structure. The concomitant field for such systems contains only 2nd order spatial dependence. However, for asymmetric gradient systems, concomitant field terms with zeroth order and first order spatial dependence are also present. As a few examples, these zeroth and first order terms cause additional image shifts in standard echo planar imaging ("EPI") sequences, echo shifts in diffusion imaging, and phase shifts in phase contrast imaging.

Various methods have been proposed for compensating the second order concomitant fields for symmetric gradient systems; however, for asymmetric gradient systems, the additional zeroth order and first order concomitant field terms are present and should be corrected.

For standard axial EPI, C. Meier, et al., proposed in "Concomitant Field Terms for Asymmetric Gradient Coils: Consequences for Diffusion, Flow, and Echo-Planar Imaging," *Magn. Reson. Med.*, 2008; 60:128-134, to add additional gradients in the z-direction to compensate for the first order self-squared terms (i.e., phase component exhibiting dependence on $G_x^2 z$ or $G_y^2 z$) that only have linear spatial dependence in the z-direction. This approach does not address a more general case with arbitrary gradient combinations where the first order cross-terms (i.e., phase components exhibiting dependence on $G_x G_z x$, $G_x G_z z$, $G_y G_z y$, or $G_y G_z z$) and self-squared terms with other spatial dependencies (i.e., in x-direction and the y-direction, including $G_z^2 x$ and $G_z^2 y$) are also present. Any adjustment to existent gradient waveforms would cause additional concomitant fields, which have not previously been considered.

Therefore, there remains a need to provide concomitant field correction and compensation for asymmetric gradient systems. Such correction and compensation techniques should be capable of addressing the full three-dimensional spatial dependency of the concomitant fields, and should avoid generating any secondary concomitant fields during the compensative correction process.

SUMMARY OF THE INVENTION

The present invention overcomes the aforementioned drawbacks by providing a method for compensating zeroth and first order concomitant field effects in data acquired with a magnetic resonance imaging ("MRI") system having an asymmetric gradient system. Gradient waveforms that will be applied during data acquisition with the MRI system are provided to a computer system and, based on those gradient waveforms, compensatory gradient waveforms are computed. When added to the provided gradient waveforms, the compensatory gradient waveforms compensate for first order concomitant field effects. In some embodiments, the compensatory gradient waveforms simultaneously compensate for first order concomitant field effects in multiple spatial directions. The gradient waveforms and compensatory gradient waveforms are then provided to the MRI system and data are acquired with the MRI system using a data acquisition that generates magnetic field gradients using the provided gradient waveforms and compensatory gradient waveforms. The acquired data are thus compensated for first order concomitant field effects by generating the magnetic field gradients using the provided gradient waveforms and the provided compensatory gradient waveforms.

In some aspects, data acquired with an MRI system that includes an asymmetric gradient system also include errors resulting from zeroth order concomitant fields, second order concomitant fields, or both, that are generated during the data acquisition by the asymmetric gradient system. In this manner, concomitant field-induced phase accumulations are determined for MRI data collected using compensatory gradients and the data are corrected during image reconstruction. Alternatively, zeroth-order concomitant field induced phase errors can also be corrected by adjusting the acquisition center frequency, which can be done in parallel with first order corrections.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for performing concomitant field corrections in magnetic resonance imaging ("MRI") systems that implement asymmetric magnetic field gradients. In general, the systems and methods described here can correct for the effects of concomitant fields of multiple orders, such as zeroth order, first order, and second order concomitant fields.

The methods described here simultaneously apply correction gradients in all x, y, and z directions to compensate for first order concomitant field effects. All first order concomitant field terms can be compensated at the same time, and the effects of additional correction gradients are also automatically considered by the methods described here. The zeroth order concomitant field terms can be retrospectively compensated by subtracting the accumulated phase from the data acquired using compensatory gradients. Similarly, second order concomitant field effects can also be corrected during image reconstruction using techniques that demodulate the spatially varying induced phase.

In some implementations, the systems and methods described here include measuring accumulated phase resulting from zeroth order concomitant fields, calculating a correction factor based on the accumulated phase, and applying the correction factor to acquired k-space data such that the effects of zeroth order concomitant fields are not present in images reconstructed from the corrected k-space data.

In some other implementations, the systems and methods described here include determining compensatory magnetic field gradients that can be applied during imaging to compensate for first order concomitant fields. In particular, these compensatory gradients can be designed to simultaneously compensate for first order concomitant fields in multiple different directions, such as in two directions (e.g., x and y) or three directions (e.g., x, y, and z). As a result, the k-space data acquired using a data acquisition scheme that incorporates these compensatory gradients will not include the effects of first order concomitant fields.

For asymmetric gradient systems, the second order concomitant field terms are also present. These terms are similar to that of the conventional symmetric gradient system. As one example, these second order terms can be compensated during image reconstruction by separation of the spatial or temporal parts of the concomitant field terms, followed by correction (e.g., with a conjugate phase method).

The concomitant field terms in an MRI system that implements asymmetric magnetic field gradients are defined as follows for the zeroth order concomitant field $B_{c,0}$, the first order concomitant field, $B_{c,1}$, and the second order concomitant field, $B_{c,2}$:

$$B_{c,0} = \frac{G_x^0 z_{0x}^2}{2B_0} + \frac{G_y^0 z_{0y}^2}{2B_0} + \frac{\alpha^2 G_z^0 x_0^2}{2B_0} + \frac{(1-\alpha)^2 G_z^0 y_0^2}{2B_0} - \frac{\alpha G_x G_z x_0 z_{0x}}{B_0} - \frac{(1-\alpha) G_y G_z y_0 z_{0y}}{B_0}. \quad (1)$$

$$B_{c,1} = \frac{G_x^2 z z_{0x}}{B_0} + \frac{G_y^2 z z_{0y}}{B_0} + \frac{\alpha^2 G_z^2 x x_0}{B_0} + \frac{(1-\alpha)^2 G_z^2 y y_0}{B_0} - \frac{\alpha G_x G_z (x z_{0x} + z x_0)}{B_0} - \frac{(1-\alpha) G_y G_z (y z_{0y} + z y_0)}{B_0}. \quad (2)$$

$$B_{c,2} = \frac{G_x^2 z^2}{2B_0} + \frac{G_y^2 z^2}{2B_0} + \frac{\alpha^2 G_z^2 x^2}{2B_0} + \frac{(1-\alpha)^2 G_z^2 y^2}{2B_0} - \frac{\alpha G_x G_z x z}{B_0} - \frac{(1-\alpha) G_y G_z y z}{B_0}. \quad (3)$$

In Eqns. (1)-(3), $G_x$ is the gradient in the x-direction; $G_y$ is the gradient in the y-direction; $G_z$ is the gradient in the z-direction; $z_{0x}$, $z_{0y}$, $x_0$, and $y_0$ are constants that describe the offsets of the transverse field components relative to the magnet isocenter; x is a spatial position in the x-direction; y is spatial position in the y-direction; z is a spatial position in the z-direction; $\alpha$ is a dimensionless asymmetry parameter that describes the relative strength of the concomitant fields along the transverse directions (e.g., the x-direction and the y-direction); and $B_0$ is the strength of the main magnetic field. For a conventional symmetric gradient MRI system, the value of $\alpha$ is typically about 0.5. The value of $\alpha$ is also typically about 0.5 for those asymmetric gradient systems where the two transverse axes (e.g. the x-axis and the y-axis) share similar designs and primarily differ from each other only by a ninety degree rotation about the z-axis. In other asymmetric gradient systems, the value of $\alpha$ may be different than 0.5.

Figure 1:
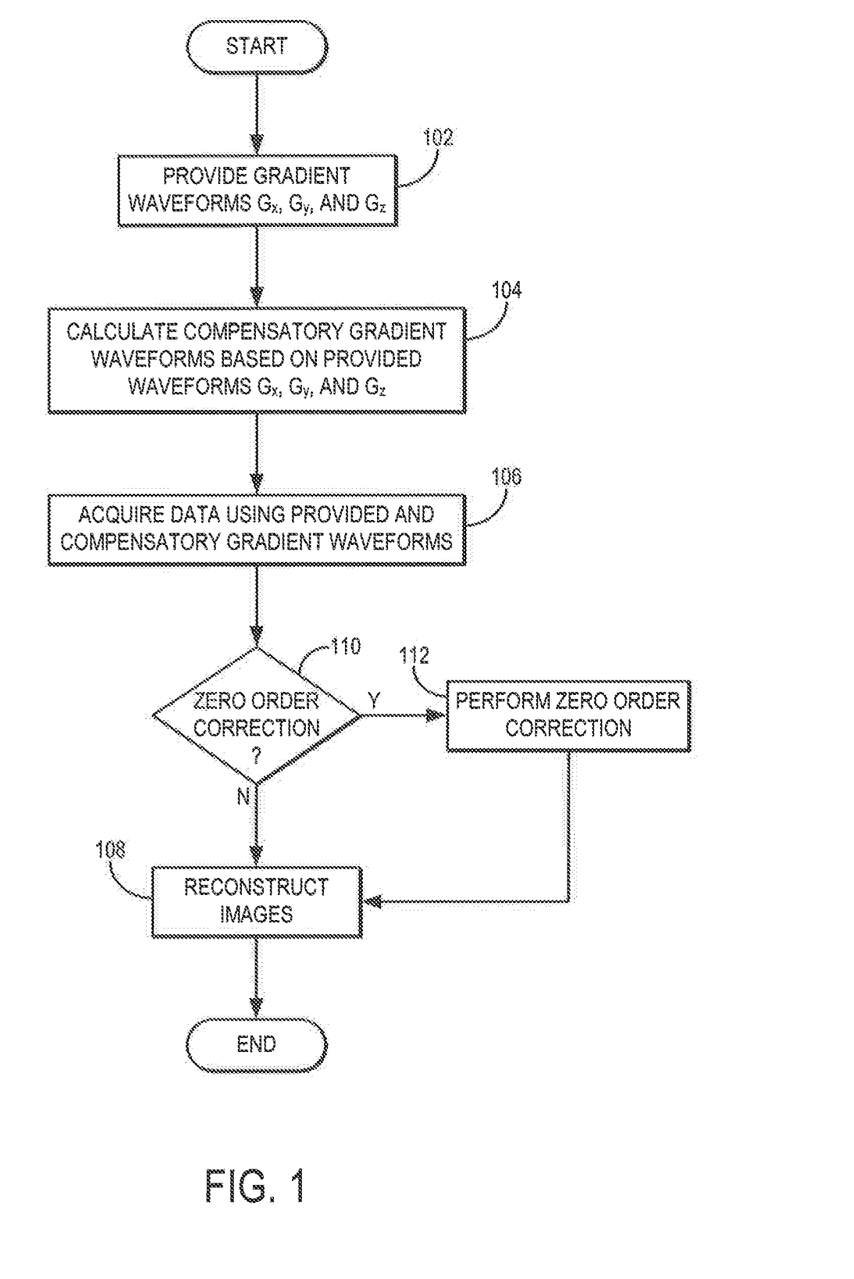
FIG. 1 is a flowchart setting forth the steps of an example of a method for compensating for first order concomitant field effects in an MRI system that implements an asymmetric gradient system.

Referring now to FIG. 1, a flowchart is illustrated as setting forth the steps of an example method for compensating for the effects of first order concomitant fields in MRI. The method includes providing to a computer system, the magnetic field gradient waveforms that will be used during data acquisition, as indicated at step 102. These gradient waveforms can be provided to an operator workstation that forms a part of the MRI system, or to another computer system or processor that is in communication with the MRI system. Based on the provided gradient waveforms, compensatory gradient waveforms are calculated, as indicated at step 104. The compensatory gradient waveforms define magnetic field gradients that compensate for the first order concomitant fields generated by the provided gradient waveforms. Using these compensatory gradients, the first order concomitant fields can be simultaneously compensated for along multiple different directions.

As an example, by solving the following system of equations, the compensatory gradient waveforms ($G_x$, $G_y$, and $G_z$) can be calculated:

$$G_x^0 = G_x + \frac{\alpha^2 G_z^2 x_0}{B_0} - \frac{\alpha G_x G_z z_{0x}}{B_0}; \quad (4)$$

$$G_y^0 = G_y + \frac{(1-\alpha)^2 G_z^2 y_0}{B_0} - \frac{(1-\alpha) G_y G_z z_{0y}}{B_0}; \quad (5)$$

$$G_z^0 = G_z + \frac{G_x^2 z_{0x}}{B_0} + \frac{G_y^2 z_{0y}}{B_0} - \frac{\alpha G_x G_z z_0}{B_0} - \frac{(1-\alpha) G_y G_z y_0}{B_0} \quad (6)$$

Figure 2:
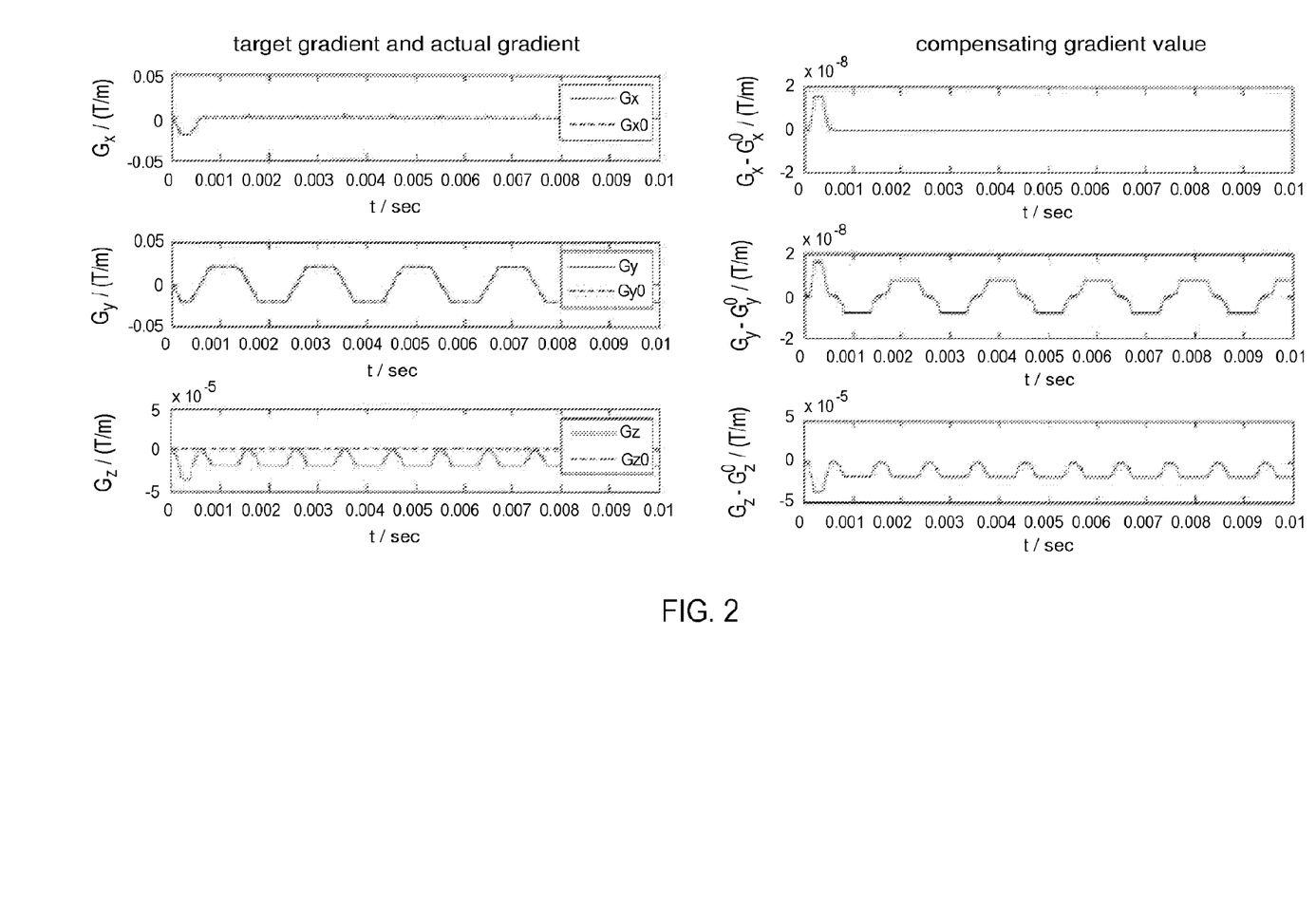
FIG. 2 illustrates example target, actual, and compensatory gradient waveforms for compensating for first order concomitant field effects in an MRI system that implements an asymmetric gradient system.

The target gradient waveforms ($G_x^0$, $G_y^0$, $G_z^0$) and compensatory gradient waveforms ($G_x$, $G_y$, $G_z$) are then communicated to the MRI system and used during an imaging scan to acquire data that have been compensated for first order concomitant field effects simultaneously along each spatial direction, as indicated at step 106. Examples of target and actual gradient waveforms, and the waveforms for compensatory gradients calculated therefrom, are illustrated in FIG. 2.

Referring again to FIG. 1, images can then be reconstructed from the acquired data, as indicated at step 108. As described below with respect to FIG. 3, before reconstruction, the data can also be corrected for the effects of zero and/or second order concomitant field effects, as indicated at decision block 110 and optional step 112. In some embodiments, the zeroth-order concomitant field induced errors can be corrected by adjusting the acquisition center frequency, which can be done in parallel with the first order corrections.

As seen in Eqn. (1), the zeroth order concomitant fields do not have spatial dependency (i.e., they do not depend on x, y, or z). As a result, the zeroth order concomitant fields can be compensated in the acquired k-space data and before image reconstruction.

Figure 3:
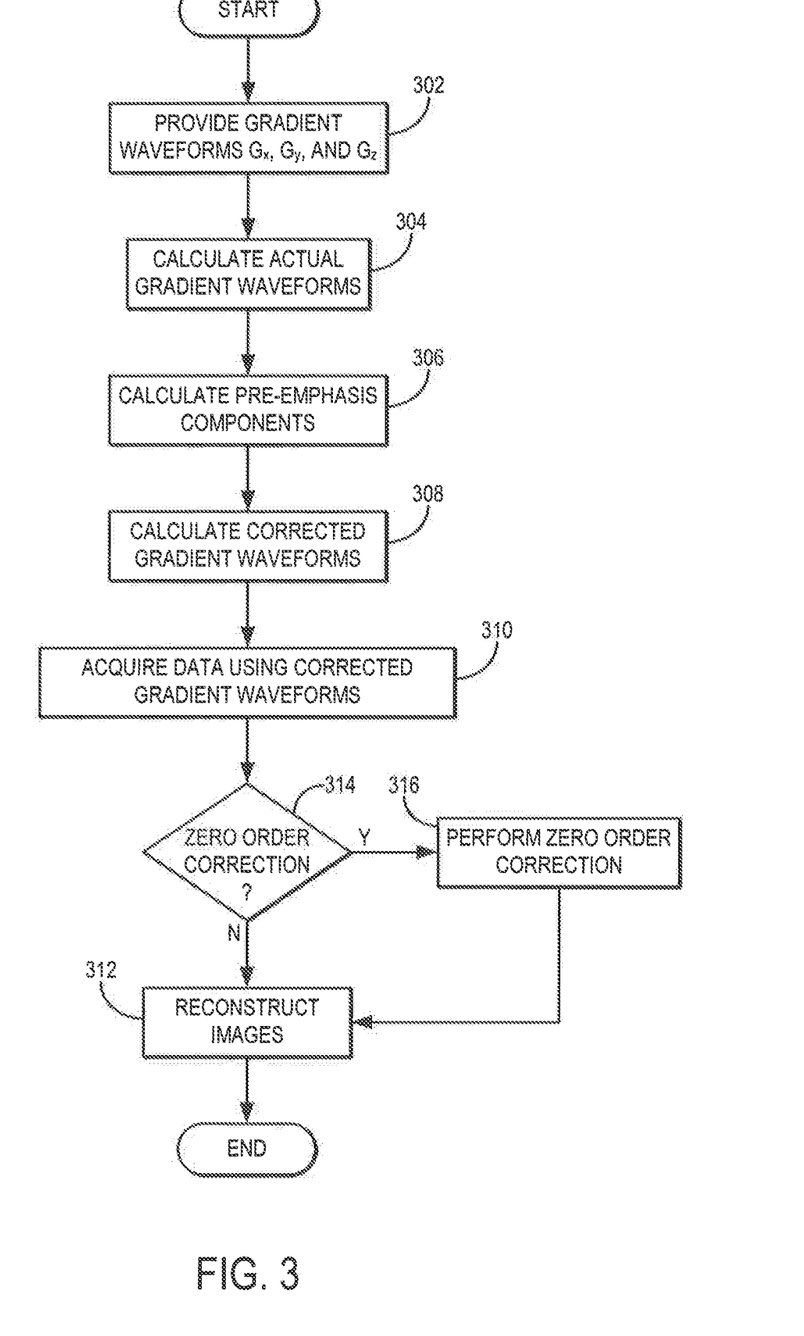
FIG. 3 is a flowchart setting forth the steps of another example method for compensating for first order concomitant field effects in an MRI system that implements an asymmetric gradient system.

Referring now to FIG. 3, a flowchart is illustrated as setting forth the steps of another example method for compensating for the effects of first order concomitant fields in MRI. The method includes providing to a computer system, the magnetic field gradient waveforms that will be used during data acquisition, as indicated at step 302. These gradient waveforms can be provided to an operator workstation that forms a part of the MRI system, or to another computer system or processor that is in communication with the MRI system. Based on the provided gradient waveforms, actual gradient waveforms after pre-emphasis at a certain time point are calculated, as indicated at step 304. These actual gradient waveforms can be denoted as, $$G_x = \frac{B_0 G_x^0}{B_0 - \left(\frac{\alpha G_z z_{0x}}{2}\right)} \approx G_x^0 \left(1 + \frac{\alpha G_z^0 z_{0x}}{B_0}\right); \quad (7)$$

$$G_y = \frac{B_0 G_y^0}{B_0 - (1-\alpha) G_z z_{0y}} = G_y^0 \left(1 + \frac{(1-\alpha) G_z^0 z_{0y}}{B_0}\right); \quad (8)$$

$$G_z \approx G_z^0 - (G_x^0)^2 \frac{z_{0x}}{B_0} - (G_y^0)^2 \frac{z_{0y}}{B_0}. \quad (9)$$

The pre-emphasis components of the gradient waveforms are then computed on a time point-by-time point basis, as indicated at step 306. In general, the pre-emphasis components can be computed by calculating the difference between the actual gradient waveforms and the prescribed gradient waveforms, as follows:

$$\Delta G_x = G_x - G_x^0 \approx \frac{\alpha G_x^0 G_z^0 z_{0x}}{B_0}; \quad (10)$$

$$\Delta G_y = G_y - G_y^0 \approx \frac{(1-\alpha) G_y^0 G_z^0 z_{0y}}{B_0}; \quad (11)$$

$$\Delta G_z = G_z - G_z^0 \approx -\frac{1}{B_0}\left(z_{0x}(G_x^0)^2 + z_{0y}(G_y^0)^2\right). \quad (12)$$

The computed pre-emphasis components can then be utilized to perform first order corrections of the actual gradients, as indicated at step 308. Data are acquired using the corrected gradients, as indicated at step 310, and images are reconstructed from the acquired data, as indicated at step 312. As described below with respect to FIG. 4, before reconstruction, the data can also be corrected for the effects of zeroth order and/or second order concomitant field effects, as indicated at decision block 314 and optional step 316. In some embodiments, the zeroth-order concomitant field induced errors can be corrected by adjusting the acquisition center frequency, which can be done in parallel with the first order corrections.

Gradient pre-emphasis based on the finite difference approximations in Eqns. (10)-(12) may not provide a complete compensation of concomitant fields due to residual effects. However, in these instances, the residual concomitant fields will be several orders of magnitude smaller than the nominal fields and, thus, will impart negligible effects on image quality. In some implementations, iterated correction based on repeated application of the approximate correction can be applied.

Figure 4:
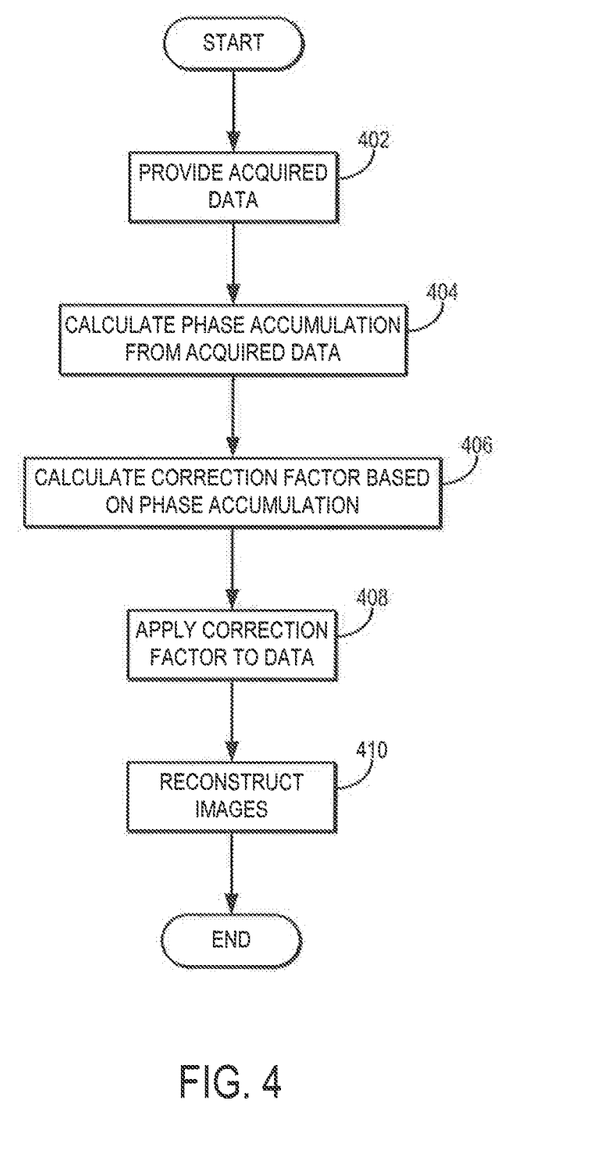
FIG. 4 is a flowchart setting forth the steps of an example of a method for correcting zeroth order concomitant field effects, second order concomitant field effects, or both, in an MRI system that implements an asymmetric gradient system and that implements compensatory gradients.

Referring now to FIG. 4, a flowchart is illustrated as setting forth the steps of an example method for compensating acquired k-space data for the effects of zeroth order concomitant fields. The method includes providing the acquired k-space data to be corrected, as indicated at step 402. As an example, the k-space data can be provided by retrieving the data from a data storage or by acquiring the data using an MRI system. The phase accumulation during data acquisition is then calculated from the provided k-space data, as indicated at step 404. For example, the phase accumulation attributable to the zeroth order concomitant field effects can be calculated as, $$\phi_{c,0}(k) = \int_0^{t(k)} \gamma B_{c,0}(\tau) d\tau; \quad (13)$$

where $\phi_{c,0}(k)$ is the phase accumulation as a function of k-space position, $\gamma$ is the gyromagnetic ratio, $t(k)$ is the duration of the magnetic field gradients, and $B_{c,0}(\tau)$ is the zeroth order concomitant field.

Based on the calculated phase accumulation, a correction factor that removes the influence of the accumulated phase in the acquired data can be calculated, as indicated at step 406. After the correction factors are calculated, they are applied to the appropriate locations in k-space, as indicated at step 408, to correct for the effects of the zeroth order concomitant fields. Images can then be reconstructed from the corrected data, as indicated at step 410. Optionally, second order concomitant field effects can also be corrected or compensated by applying known techniques for correcting or compensating second order concomitant field effects in MRI systems that implement symmetric gradient systems.

In some other implementations, the zeroth order concomitant field effects can be corrected by adjusting the central demodulation frequency based on the gradient waveforms. The frequency offset caused by zeroth order concomitant fields at any time point, t, can be described as, $$\Delta f_{c,0th}(t) = \frac{\gamma}{2\pi} \frac{(G_x^2 z_{0x}^2 + G_y^2 z_{0y}^2)}{2B_0}. \quad (14)$$

A new demodulation frequency can be computed at each time point as follows, $$f_{new}(t) = f_0 + \Delta f_{c,0th} = \frac{\gamma}{2\pi} B_0 + \frac{\gamma}{2\pi} \frac{(G_x^2 z_{0x}^2 + G_y^2 z_{0y}^2)}{2B_0};\quad (15)$$

where $f_0$ is the original demodulation frequency and $\Delta f_{c,0th}$ is the frequency offset caused by the zeroth order concomitant fields. Zeroth-order phase correction can be performed prospectively by adjusting the center carrier frequency to account for anticipated concomitant field induced phase errors, or retrospectively during reconstruction.

Figure 5:
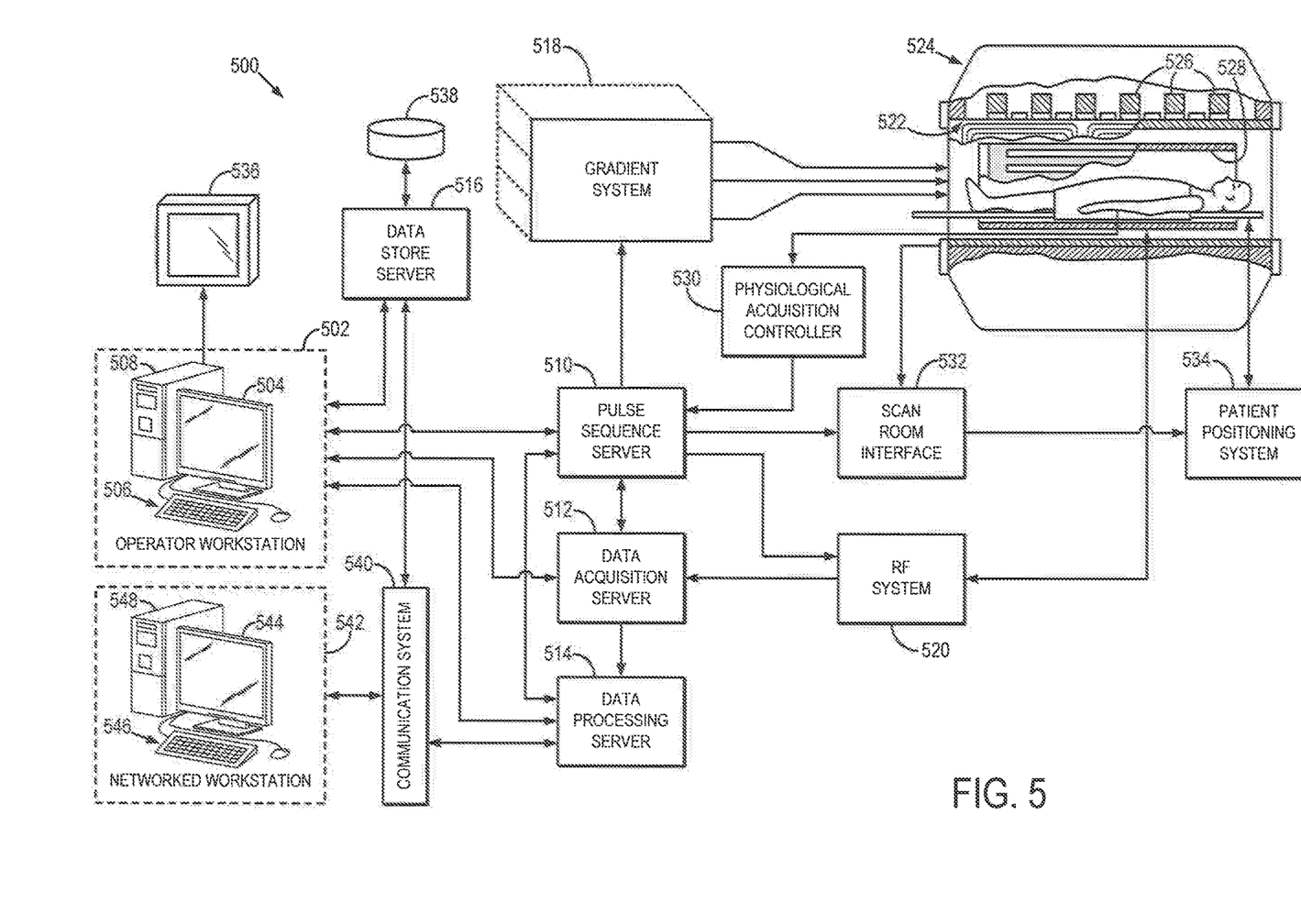
FIG. 5 is a block diagram of an example of a magnetic resonance imaging ("MRI") system.

Referring particularly now to FIG. 5, an example of a magnetic resonance imaging ("MRI") system 500 is illustrated. The MRI system 500 includes an operator workstation 502, which will typically include a display 504; one or more input devices 506, such as a keyboard and mouse; and a processor 508. The processor 508 may include a commercially available programmable machine running a commercially available operating system. The operator workstation 502 provides the operator interface that enables scan prescriptions to be entered into the MRI system 500. In general, the operator workstation 502 may be coupled to four servers: a pulse sequence server 510; a data acquisition server 512; a data processing server 514; and a data store server 516. The operator workstation 502 and each server 510, 512, 514, and 516 are connected to communicate with each other. For example, the servers 510, 512, 514, and 516 may be connected via a communication system 540, which may include any suitable network connection, whether wired, wireless, or a combination of both. As an example, the communication system 540 may include both proprietary or dedicated networks, as well as open networks, such as the internet.

The pulse sequence server 510 functions in response to instructions downloaded from the operator workstation 502 to operate a gradient system 518 and a radiofrequency ("RF") system 520. Gradient waveforms necessary to perform the prescribed scan are produced and applied to the gradient system 518, which excites gradient coils in a gradient coil assembly 522 to produce the magnetic field gradients $G_x$, $G_y$, and $G_z$ used for position encoding magnetic resonance signals. The gradient coil assembly 522 forms part of a magnet assembly 524 that includes a polarizing magnet 526 and a whole-body RF coil 528.

RF waveforms are applied by the RF system 520 to the RF coil 528, or a separate local coil (not shown in FIG. 5), in order to perform the prescribed magnetic resonance pulse sequence. Responsive magnetic resonance signals detected by the RF coil 528, or a separate local coil (not shown in FIG. 5), are received by the RF system 520, where they are amplified, demodulated, filtered, and digitized under direction of commands produced by the pulse sequence server 510. The RF system 520 includes an RF transmitter for producing a wide variety of RF pulses used in MRI pulse sequences. The RF transmitter is responsive to the scan prescription and direction from the pulse sequence server 510 to produce RF pulses of the desired frequency, phase, and pulse amplitude waveform. The generated RF pulses may be applied to the whole-body RF coil 528 or to one or more local coils or coil arrays (not shown in FIG. 5).

The RF system 520 also includes one or more RF receiver channels. Each RF receiver channel includes an RF preamplifier that amplifies the magnetic resonance signal received by the coil 528 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \quad (16);$$

and the phase of the received magnetic resonance signal may also be determined according to the following relationship:

$$\varphi = \tan^{-1}\left(\frac{Q}{I}\right). \quad (17)$$

The pulse sequence server 510 also optionally receives patient data from a physiological acquisition controller 530. By way of example, the physiological acquisition controller 530 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 510 to synchronize, or "gate," the performance of the scan with the subject's heart beat or respiration.

The pulse sequence server 510 also connects to a scan room interface circuit 532 that receives signals from various sensors associated with the condition of the patient and the magnet system. It is also through the scan room interface circuit 532 that a patient positioning system 534 receives commands to move the patient to desired positions during the scan.

The digitized magnetic resonance signal samples produced by the RF system 520 are received by the data acquisition server 512. The data acquisition server 512 operates in response to instructions downloaded from the operator workstation 502 to receive the real-time magnetic resonance data and provide buffer storage, such that no data is lost by data overrun. In some scans, the data acquisition server 512 does little more than pass the acquired magnetic resonance data to the data processing server 514. However, in scans that require information derived from acquired magnetic resonance data to control the further performance of the scan, the data acquisition server 512 is programmed to produce such information and convey it to the pulse sequence server 510. For example, during prescans, magnetic resonance data is acquired and used to calibrate the pulse sequence performed by the pulse sequence server 510. As another example, navigator signals may be acquired and used to adjust the operating parameters of the RF system 520 or the gradient system 518, or to control the view order in which k-space is sampled. In still another example, the data acquisition server 512 may also be employed to process magnetic resonance signals used to detect the arrival of a contrast agent in a magnetic resonance angiography ("MRA") scan. By way of example, the data acquisition server 512 acquires magnetic resonance data and processes it in real-time to produce information that is used to control the scan.

The data processing server 514 receives magnetic resonance data from the data acquisition server 512 and processes it in accordance with instructions downloaded from the operator workstation 502. Such processing may, for example, include one or more of the following: reconstructing two-dimensional or three-dimensional images by performing a Fourier transformation of raw k-space data;

performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 514 are conveyed back to the operator workstation 502 where they are stored. Real-time images are stored in a data base memory cache (not shown in FIG. 5), from which they may be output to operator display 512 or a display 536 that is located near the magnet assembly 524 for use by attending physicians. Batch mode images or selected real time images are stored in a host database on disc storage 538. When such images have been reconstructed and transferred to storage, the data processing server 514 notifies the data store server 516 on the operator workstation 502. The operator workstation 502 may be used by an operator to archive the images, produce films, or send the images via a network to other facilities.

The MRI system 500 may also include one or more networked workstations 542. By way of example, a networked workstation 542 may include a display 544; one or more input devices 546, such as a keyboard and mouse; and a processor 548. The networked workstation 542 may be located within the same facility as the operator workstation 502, or in a different facility, such as a different healthcare institution or clinic.

The networked workstation 542, whether within the same facility or in a different facility as the operator workstation 502, may gain remote access to the data processing server 514 or data store server 516 via the communication system 540. Accordingly, multiple networked workstations 542 may have access to the data processing server 514 and the data store server 516. In this manner, magnetic resonance data, reconstructed images, or other data may be exchanged between the data processing server 514 or the data store server 516 and the networked workstations 542, such that the data or images may be remotely processed by a networked workstation 542. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for compensating first order concomitant field effects in data acquired with a magnetic resonance imaging (MRI) system having an asymmetric gradient system, the steps of the method comprising:
   (a) providing to a computer system, gradient waveforms that will be applied during data acquisition with the MRI system;
   (b) computing with the computer system, compensatory gradient waveforms that when added to the provided gradient waveforms compensate for first order concomitant field effects;
   (c) providing the gradient waveforms and the compensatory gradient waveforms to the MRI system; and
   (d) acquiring data with the MRI system using a data acquisition that generates magnetic field gradients using the provided gradient waveforms and the provided compensatory gradient waveforms, wherein the acquired data are compensated for first order concomitant field effects by generating the magnetic field gradients using the provided gradient waveforms and the provided compensatory gradient waveforms.

2. The method as recited in claim 1, further comprising reconstructing at least one image from the corrected data, wherein errors attributable to the first order concomitant fields effects are mitigated in the at least one image.

3. The method as recited in claim 1, wherein the compensatory gradient waveforms computed in step (b) compensate for first order concomitant field effects simultaneously in at least two spatial directions.

4. The method as recited in claim 3, wherein the compensatory gradient waveforms computed in step (b) compensate for first order concomitant field effects simultaneously in three spatial directions.

5. The method as recited in claim 1, wherein the data acquired in step (d) includes errors resulting from zeroth order concomitant fields generated during the data acquisition by the asymmetric gradient system, and further comprising:
   calculating a phase accumulation attributable to the zeroth order concomitant fields at each k-space location represented in the acquired data;
   determining a correction factor for each k-space location represented in the acquired data, each correction factor being determined based on the phase accumulation calculated at the respective k-space location; and
   producing corrected data by applying the correction factors to the acquired data, the corrected data being corrected for the errors resulting from zeroth order concomitant fields generated during data acquisition by the asymmetric gradient system.

6. The method as recited in claim 5, further comprising reconstructing at least one image from the corrected data, wherein errors attributable to the zeroth order concomitant fields and errors attributable to the first order concomitant fields effects are mitigated in the at least one image.

7. The method as recited in claim 5, wherein calculating the phase accumulation at each k-space location is based on an integration of the zeroth order concomitant field over a duration during which magnetic field gradients were applied by the asymmetric gradient system.

8. The method as recited in claim 5, wherein each correction factor is determined to negate the phase accumulation attributable to the zeroth order concomitant fields calculated at the respective k-space location.

9. The method as recited in claim 5, wherein applying the correction factors to the acquired data includes multiplying each k-space location represented in the acquired data by the correction factor determined for each respective k-space location.

10. The method as recited in claim 5, wherein the data acquired in step (d) also includes errors resulting from second order concomitant fields generated during the data acquisition by the asymmetric gradient system, and wherein calculating the phase accumulation at each k-space location is also based on an integration of a second order concomitant field over a duration during which magnetic field gradients were applied by the asymmetric gradient system.

11. The method as recited in claim 10, wherein each correction factor is determined to also negate the phase accumulation attributable to the second order concomitant fields and applied, followed by correction with conjugate phase method.

12. The method as recited in claim 5, wherein applying the correction factors to the acquired data includes separation of the spatial or temporal parts of the concomitant field terms.

13. The method as recited in claim 1, wherein the data acquired in step (d) includes errors resulting from zeroth order concomitant fields generated during the data acquisition by the asymmetric gradient system, and further comprising correcting the acquired data for the errors resulting from the zeroth order concomitant fields using a demodulation frequency that is computed based on an original demodulation frequency and a frequency offset caused by the zeroth order concomitant fields.

14. The method as recited in claim 1, wherein step (b) includes computing the compensatory gradients using a center frequency that has been prospectively adjusted to account for zeroth-order concomitant fields that will be induced during data acquisition.

15. A method for compensating first order concomitant field effects in data acquired with a magnetic resonance imaging (MRI) system having an asymmetric gradient system, the steps of the method comprising:

(a) providing to a computer system, gradient waveforms that will be applied during data acquisition with the MRI system;

(b) computing with the computer system, actual gradient waveforms that will be generated by the MRI system, the actual gradient waveforms being based on the provided gradient waveforms;

(c) computing pre-emphasis components based on a difference between the provided gradient waveforms and the actual gradient waveforms;

(d) computing with the computer system, corrected gradient waveforms using the pre-emphasis components;

(e) providing the corrected gradient waveforms to the MRI system; and (f) acquiring data with the MRI system using a data acquisition that generates magnetic field gradients using the corrected gradient waveforms, wherein the acquired data are compensated for first order concomitant field effects by generating the magnetic field gradients using the corrected gradient waveforms.

16. The method as recited in claim 1, wherein the gradient pre-emphasis components computed in step (c) are dynamically determined using a fast approximation technique.

* * * * *